US012255643B2

United States Patent
Makkinga et al.

(10) Patent No.: US 12,255,643 B2
(45) Date of Patent: Mar. 18, 2025

(54) PROXIMITY SWITCH AND METHOD FOR DETECTING AN OBJECT TO BE SENSED

(71) Applicant: TURCK Holding GmbH, Halver (DE)

(72) Inventors: Alexander Magnus Makkinga, Muelheim an der Ruhr (DE); Oliver Marks, Duisburg (DE); Michael Faber, Luedenscheid (DE)

(73) Assignee: TURCK HOLDING GMBH, Halver (DE)

( * ) Notice: Subject to any disclaimer, the term of this patent is extended or adjusted under 35 U.S.C. 154(b) by 0 days.

(21) Appl. No.: 17/149,767

(22) Filed: Jan. 15, 2021

(65) Prior Publication Data
US 2021/0226625 A1   Jul. 22, 2021

(30) Foreign Application Priority Data
Jan. 16, 2020 (DE) ...................... 10 2020 100 939.9

(51) Int. Cl.
*H03K 17/95* (2006.01)
*H03K 17/955* (2006.01)

(52) U.S. Cl.
CPC ....... *H03K 17/954* (2013.01); *H03K 17/9545* (2013.01); *H03K 17/955* (2013.01)

(58) Field of Classification Search
None
See application file for complete search history.

(56) References Cited

U.S. PATENT DOCUMENTS

| | | | | |
|---|---|---|---|---|
| 4,763,071 A * | 8/1988 | McGee | ................... | G01N 27/02 324/229 |
| 5,099,227 A * | 3/1992 | Geiszler | ................... | G07C 9/28 235/440 |
| 5,119,022 A * | 6/1992 | Kranbuehl | ........... | G01N 27/023 324/234 |
| 6,277,771 B1 * | 8/2001 | Nishimura | ........... | D03D 15/573 442/256 |
| 6,603,306 B1 * | 8/2003 | Olsson | ................. | H03K 17/945 340/552 |
| 6,614,322 B2 * | 9/2003 | Richardson | .......... | H03B 5/1203 331/177 V |
| 7,112,816 B2 * | 9/2006 | Schlaf | ................... | H10K 10/466 977/938 |
| 7,610,797 B2 * | 11/2009 | Mancevski | ............ | G01Q 60/38 850/58 |
| 9,479,165 B2 * | 10/2016 | Kuehn | ............... | H03K 17/9547 |
| 9,767,329 B2 * | 9/2017 | Forster | ................ | H04W 12/122 |

(Continued)

FOREIGN PATENT DOCUMENTS

| CN | 110568064 | * | 12/2019 |
|---|---|---|---|
| CN | 110568064 A | | 12/2019 |

(Continued)

*Primary Examiner* — Thomas J. Hiltunen
*Assistant Examiner* — Khareem E Almo
(74) *Attorney, Agent, or Firm* — LEYDIG, VOIT & MAYER, LTD.

(57) ABSTRACT

The present disclosure provides a proximity switch. The proximity switch includes an oscillating circuit. The oscillating circuit is configured to detect an object to be sensed. The oscillating circuit has a resonant frequency, and the resonant frequency is in a range of from 0.8 MHz to 20 MHz. The present disclosure further provides a method for detecting an object to be sensed.

19 Claims, 2 Drawing Sheets

(56) References Cited

U.S. PATENT DOCUMENTS

| | | | |
|---|---|---|---|
| 10,859,617 B2 * | 12/2020 | Condorelli | G01D 5/20 |
| 2002/0167439 A1 * | 11/2002 | Bloch | G01D 5/2013 |
| | | | 342/28 |
| 2005/0184814 A1 | 8/2005 | Ehls | |
| 2009/0051445 A1 * | 2/2009 | Ellis | A61B 5/07 |
| | | | 331/65 |
| 2009/0243615 A1 * | 10/2009 | Kuehn | H03K 17/954 |
| | | | 324/326 |
| 2010/0148882 A1 * | 6/2010 | Bouttement | H03B 5/1256 |
| | | | 331/36 L |
| 2010/0219840 A1 * | 9/2010 | Motojima | H03K 17/955 |
| | | | 324/633 |
| 2014/0139347 A1 * | 5/2014 | Forster | H04K 3/86 |
| | | | 340/10.6 |
| 2014/0167867 A1 * | 6/2014 | Ahmed | H03B 5/1256 |
| | | | 331/117 R |
| 2017/0090599 A1 * | 3/2017 | Kuboyama | H03K 17/962 |
| 2018/0045538 A1 * | 2/2018 | Thoss | G01D 3/0365 |
| 2019/0018051 A1 * | 1/2019 | Condorelli | H03K 17/954 |
| 2020/0018820 A1 * | 1/2020 | Eberspaecher | G01S 13/08 |
| 2020/0025964 A1 * | 1/2020 | Kubo | G01D 5/24 |
| 2020/0232824 A1 * | 7/2020 | Kubo | G01D 5/2405 |
| 2021/0226625 A1 * | 7/2021 | Makkinga | H03K 17/954 |
| 2022/0065664 A1 * | 3/2022 | Hristov | H03K 17/9505 |

FOREIGN PATENT DOCUMENTS

| | | | |
|---|---|---|---|
| DE | 102020100939 A1 * | 7/2021 | H03K 17/954 |
| EP | 1 526 645 A1 | 4/2005 | |
| EP | 3644510 A1 * | 4/2020 | G01D 5/202 |

* cited by examiner

PROXIMITY SWITCH AND METHOD FOR DETECTING AN OBJECT TO BE SENSED

CROSS-REFERENCE TO PRIOR APPLICATIONS

Priority is claimed to German Patent Application No. DE 10 2020 100 939.9, filed on Jan. 16, 2020, the entire disclosure of which is hereby incorporated by reference herein.

FIELD

The present disclosure relates the field of proximity switches and automation technology, and more specifically, to a proximity switch, a method for detecting an object to be sensed, and the use of a frequency range for a detection signal.

BACKGROUND

Proximity switches are used, in particular in automation technology, to detect the presence or absence of an object to be sensed. For example, in a production plant this can be used to detect the presence or absence of an object to be sensed, in order in the case of the presence of the object to carry out one or more production steps on the object.

Typically, proximity switches are based on an electromagnetic, in particular capacitive and/or inductive, detection of the object to be sensed, wherein the proximity switch has an oscillating circuit, by means of which a detection signal is emitted and, if present, a received signal is received, amplified and evaluated. As a result of an electromagnetic interaction of an object to be sensed located in the vicinity with the detection signal and the signal reflected by the object, the presence or absence of an object to be sensed can be ascertained by means of the received signal. Conventionally this requires that the object to be sensed is formed of a metallic material or consists at least for the most part of a metallic material, as otherwise the electromagnetic, such as for example inductive, interaction of the object with the proximity switch is too small and the proximity switch would not recognize the object to be sensed.

A conventional proximity switch is known for example from the published document EP 1 526 645 A1. Conventionally the use of proximity switches is therefore limited to the detection of metallic objects. If a metallic object now approaches the proximity switch, eddy currents are generated in the object. These eddy currents generate an opposing field to the exciting field. This opposing field has a different strength in the receiver coils of the proximity switch. It thus induces voltages of different magnitudes in the two receiver coils. The differential signal of these two voltages deviates from zero and can be amplified in order to form the output signal. The metallic object therefore serves as trigger for the proximity switch.

SUMMARY

In an embodiment, the present invention provides a proximity switch. The proximity switch includes an oscillating circuit configured to detect an object to be sensed. The oscillating circuit has a resonant frequency in a range of from 0.8 MHz to 20 MHz.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
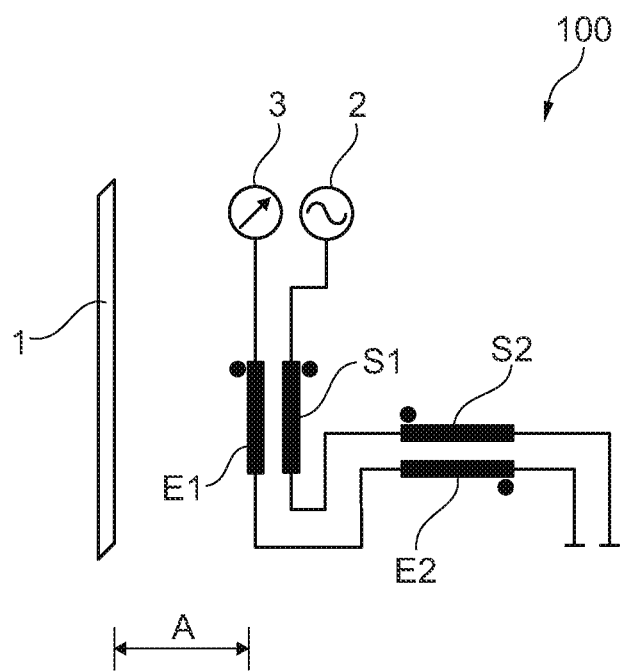
FIG. 1 provides a schematic representation of the basic principle of a conventional proximity switch.

The present disclosure describes a proximity switch and a method, which are suitable for detecting objects which are formed of carbon material or at least partially consist of carbon material.

In a first aspect, the disclosure relates to proximity switches with an oscillating circuit for detecting an object to be sensed, wherein the proximity switch is characterized in that the oscillating circuit has a resonant frequency in the range of from 0.8 MHz to 20 MHz.

In a further aspect, the disclosure relates to a method for detecting an object to be sensed by means of a proximity switch. The method comprises emitting a detection signal at a frequency in the range of from 0.8 MHz to 20 MHz by means of the proximity switch.

In a further aspect, the disclosure relates to the use of a frequency in the range of from 0.8 MHz to 20 MHz for a detection signal for detecting an object to be sensed by means of a proximity switch.

To say that the oscillating circuit has a resonant frequency in the range of from 0.8 MHz to 20 MHz means that the resonant frequency lies in the specified range. This does not require that the oscillating circuit must be excitable to resonance in the entire range specified, but only that the resonant frequency lies within the specified range. The resonant frequency can for example represent a narrow-band frequency range which lies entirely within the specified range. The range specified for the resonant frequency furthermore does not rule out that a higher harmonic oscillation of the resonant frequency can lie outside the specified range. The resonant frequency is a frequency at which the oscillating circuit can be excited and at which the oscillating circuit can radiate and receive electromagnetic waves.

The method for detecting the object to be sensed is preferably based on the fact that the detection signal is emitted by means of the proximity switch, in particular at the resonant frequency of the oscillating circuit of the proximity switch. If an object to be sensed is located in the vicinity, i.e. in the detection range, of the proximity switch, an electromagnetic, in particular capacitive, interaction takes place, with the result that a reflected signal is generated which can then be detected by the proximity switch and evaluated.

A carbon material is in particular a material which consists at least partially and preferably entirely of carbon fibres. Carbon fibres are fibres industrially manufactured from carbon-containing raw materials. Carbon fibres have advantageous properties in relation to the weight and in terms of strength compared with steel and are therefore often used to manufacture components. Carbon fibres typically have both high tensile strength and flexural strength and are resistant to corrosion. Carbon fibres typically retain these properties up to 2500° C. in the absence of oxygen. The density of carbon fibres is 1.8 g/cm$^3$, whereas the density of aluminium is 2.7 g/cm$^3$ and of steel is even 7.8 g/cm$^3$. Further advantages are a good electrical and thermal conductivity of carbon fibres or carbon materials. A carbon material can also be present as carbon fibre reinforced plastic (CFRP) or also called carbon fibre for short (colloquially). Carbon fibre reinforced plastic is a composite material, in which carbon fibres are embedded in a plastic matrix. The matrix serves to bind the fibres together and to fill the gaps. The material epoxy resin is often chosen as matrix. However, other thermosets or also thermoplastics are also possible as matrix material.

The invention offers the advantage that sensing or detecting those objects which consist at least partially or even entirely of carbon material, or are at least partially formed thereof, is also made possible. In other words, for the detection of the object to be sensed it is not necessary for the object to be sensed to consist at least partially or even entirely of a metallic material. Instead, the invention offers the possibility of also reliably recognizing objects made of carbon materials.

The range for the resonant frequency of from 0.8 MHz to 20 MHz offers the advantage that in this frequency range eddy currents can be generated particularly effectively in carbon materials and accordingly this frequency range is particularly well suited to the detection of objects made of carbon material. In addition, this range for the resonant frequency also allows objects made of metallic materials, such as for instance steel, to be sensed or detected.

Furthermore, the invention offers the advantage that the objects made of carbon material can also be reliably recognized at a switching distance such as is typically the case for metallic objects. For example, the switching distance can lie in a range of from 1 mm to 100 mm, preferably in the range of from 5 mm to 40 mm. The switching distance can be dependent on the design of the proximity switch, such as for instance on the diameter of the housing and/or on the diameter of the transmitting and/or receiving coils. This offers the advantage that production plants need not be modified towards smaller switching distances and furthermore an increased risk of collisions due to smaller switching distances need not be accepted.

Moreover, the invention offers the advantage that a proximity switch and a method are not only suitable for the detection of objects made of carbon material, but in addition also function reliably for the detection of objects to be sensed made of metallic materials. This offers the advantage that the proximity switch is suitable both for the detection of objects made of carbon material and for the sensing of objects made of metallic material. This renders a replacement of the proximity switch and/or an alteration of the switching distances unnecessary in the case of a change in production from metallic objects to carbon material objects, or vice versa, and as a result makes a substantial cost saving possible.

The invention runs contrary to the previous opinions and expectations of a person skilled in the art, as there were sometimes good reasons to use a much lower frequency in the range of from 200 to 600 kHz for proximity switches. This is due on the one hand to the fact that this lower frequency range is suitable for the detection of metallic materials, in particular steel, and on the other hand to the fact that the use of frequencies higher than 600 kHz can be fraught with disadvantages and higher demands are to be made on the proximity switch. For example, the use of higher frequencies has conventionally been avoided, in order to prevent the occurrence of dead bands and/or secondary switching points and in order to reduce a negative influence of a metallic environment (not to be sensed), which can have a negative effect on the sensitivity. The inventors have however recognized that the use of higher frequencies offers advantages and is in particular advantageous for the sensing of objects made of carbon materials.

The resonant frequency of the oscillating circuit preferably lies in the range of from 1 MHz to 20 MHz, still further preferably lies in the range of from 1 MHz to 14 MHz. This frequency range offers the advantage that it is particularly well suited to the detection of objects made of carbon material.

The proximity switch preferably comprises at least a first transmitting coil, a second transmitting coil and a capacitor, wherein the first transmitting coil, the second transmitting coil and the capacitor form the oscillating circuit. In addition to the transmitting coils, separate receiving coils are preferably also formed, which serve as receiving coil arrangement. The second transmitting coil is preferably arranged relative to the first coil in such a way that an eddy current field caused by the detection signal in the object to be sensed has the smallest possible influence on the second one. In other words, it is advantageous if the second coil of the receiving coil arrangement is arranged such that it is virtually unable to be influenced by the eddy current field. This can be effected in that the first and the second transmitting coils are at an angle to each other and are preferably arranged at a right angle to each other. The first and the second transmitting coils are preferably formed similar or even identical and differ only in their arrangement or alignment. The same preferably applies correspondingly to the receiving coils.

The first transmitting coil and/or the second transmitting coil, preferably the first transmitting coil and the second transmitting coil, are preferably each formed as a printed transmitting coil. For one thing, this offers the advantage that the coils can be produced with little effort and with low production costs. Moreover, this offers the advantage that the transmitting coils can be produced with a very low inductance. This is advantageous particularly as the coils have to have a very small inductance for the matching of the oscillating circuit with respect to a resonant frequency in the range of from 0.8 MHz to 20 MHz. For example, the first and the second coils are formed with an inductance in the range of from approximately 0.4 µH to 4 µH.

The first transmitting coil and/or the second transmitting coil preferably has an inductance in the range of from 0.4 µH to 4 µH. The capacitor preferably has a capacitance in the range of from approximately 22 pF to 2200 pF.

The proximity switch furthermore preferably comprises an oscillator or generator for exciting the oscillating circuit and/or an amplifier for amplifying a received signal received by the oscillating circuit. The amplifier preferably has at least one filter stage and at least one capacitive element, which are matched to the resonant frequency of the oscillating circuit. For example, the one or more filter stages can be set up to amplify or pass on signals in the desired frequency range and to filter out frequencies outside the mentioned range. The generator or oscillator is preferably adapted to excite the oscillating circuit to generate electromagnetic waves in the range of from 0.8 MHz to 20 MHz, preferably from 1 MHz to 20 MHz, most preferably from 1 MHz to 14 MHz.

The amplifier and/or the generator are preferably set up to reduce external capacitive influences on a phase position of the excitation of the oscillating circuit. In other words, the amplifier is preferably set up to bring about the excitation of the oscillating circuit in such a way that external influences as far as possible have no influence on the amplitude, frequency and phase position of the excitation signal and correspondingly on the electromagnetic radiation emitted by the oscillating circuit.

The features and embodiments mentioned above and explained in the following are not only to be regarded as disclosed in the combinations explicitly mentioned in each case, but are also encompassed by the disclosure content in other technically meaningful combinations and embodiments.

Further details and advantages of the invention are now to be explained in more detail by means of the following examples and preferred embodiments with reference to the figures.

In the following figures, the same or similar elements in the various embodiments are given the same reference numbers for the sake of simplicity.

The basic principle represented in FIG. 1 shows a proximity switch 100 with two pairs of coils, wherein each pair of coils has in each case one transmitting coil S1, S2 and one receiving coil E1, E2. The coils, together with a capacitor, form an electromagnetic oscillating circuit.

The first pair of coils is formed by the transmitting coil S1 and the receiver coil E1. These two coils are arranged coaxially to each other and have the same winding direction. Provided functionally distanced from this first pair of coils is a second pair of coils which consists of the compensating coil S2, which is connected in series with the transmitting coil S1, and the second coil E2 of the receiving coil arrangement, which is connected in series with the first coil E1 of the receiving coil arrangement. The compensating coil S2 and the second coil E2 of the receiving coil arrangement likewise lie on top of each other and are arranged coaxially to each other, but the two coils are wound in opposite directions. The transmitting coil arrangement consisting of the two coils S1 and S2 is connected to a generator 2. This generator 2 supplies both coils S1 and S2 with an alternating voltage. The exciting field emitted by the transmitting coil S1 generates eddy currents in a metallic trigger 1 (for example in an object to be sensed) which approaches the transmitting coil S1. These eddy currents generate an opposing field to the exciting field. This eddy current field is superposed in the receiving coil E1 with the exciting field generated by the transmitting coil S1. As a result of the opposite directions of the two fields, the effective magnetic field that is present in the receiver coil E1 is weakened. This has the consequence that a slightly lower voltage is induced in the receiver coil E1.

A magnetic field is generated by the second transmitting coil S2, which has previously been referred to as the compensating coil. This magnetic field induces a voltage in the second receiver coil E2. The two receiver coils E1 and E2 are tuned to the two transmitting coils S1 and S2 such that the differential output signal is precisely zero when the trigger 1 is away. This is achieved by the two windings having the same winding direction in the case of one of the two pairs of coils (for example S1, E1) and the two coils being wound in opposite directions in the case of the other pair of coils (for example S2, E2).

The pair of coils having the compensating coil S2 is arranged such that it is virtually uninfluenced by the eddy current field. This has the consequence that the differential output signal 3 does not have a reducing component as in the case of the state of the art, but substantially consists of the induction component which the eddy current field generates.

Figure 2:
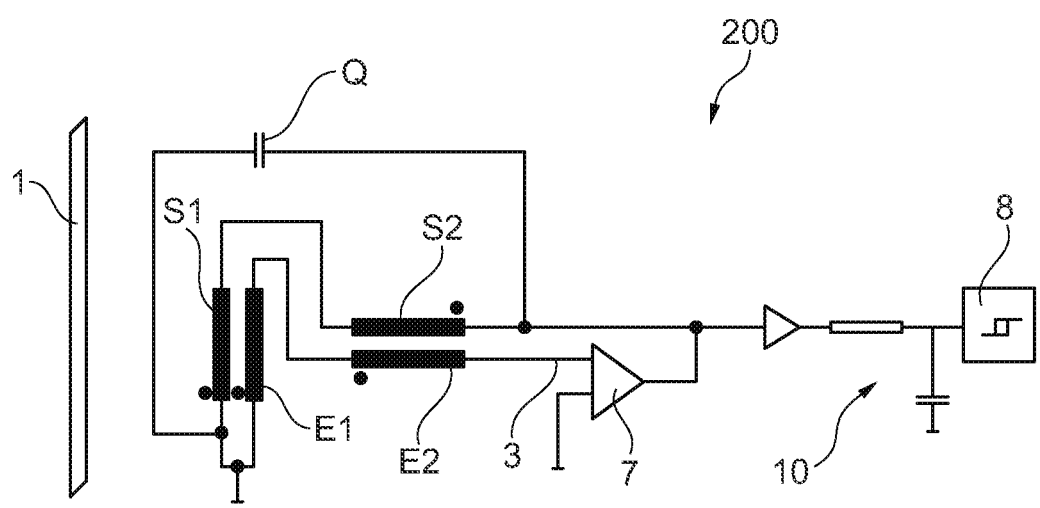
FIG. 2 provides a schematic representation of a proximity switch according to a preferred embodiment.

FIG. 2 shows a proximity switch 200 according to a preferred embodiment of the invention. In the embodiment represented in FIG. 2, the two transmitting coils S1 and S2, with a capacitor K, form an oscillating circuit the resonant frequency of which lies in the range of from 0.8 MHz to 20 MHz, for example at 7 MHz. This is excited by the output signal of an amplifier 7. The input signal of the amplifier is the differential voltage signal at point 3 of the two receiver coils E1 and E2. The output signal of the amplifier is not only fed back into the oscillator or oscillating circuit, but arrives at a limit value switch 8, which supplies the output signal, via a filter stage, which functions as low-pass filter 10. The circuit represented in FIG. 2 can be set such that the system oscillates even if the trigger 1 is far away. When the trigger approaches, the transmitting field or the detection signal is weakened or disrupted in such a way that the oscillation breaks off. The reverse mode of operation is also possible. In the starting position, with the trigger away, the system does not oscillate. Only when the trigger approaches the transmitting coil S1 does it begin to oscillate.

The filter stage is formed in such a way that its low-pass filter function is matched to the resonant frequency of the oscillating circuit, in order to filter out the frequency of the oscillating circuit as effectively as possible and to obtain the differential signal in as isolated a form as possible. The high resonant frequency in the range of from 0.8 MHz to 20 MHz offers the advantage that the proximity switch is suitable for the detection of objects made of carbon material, which is not possible with conventional proximity switches at a frequency between 200 and 600 kHz.

Figure 3:
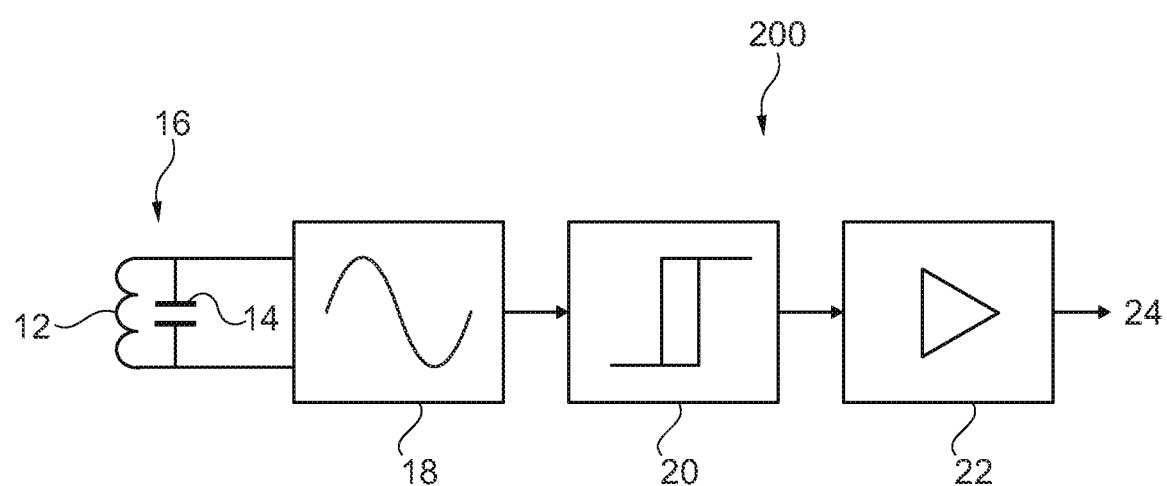
FIG. 3 provides a schematic representation of the functional principle of a proximity switch for the use according to a preferred embodiment.

FIG. 3 shows a schematic representation of the functional principle of a proximity switch 200 for the use according to a preferred embodiment. The proximity switch comprises a coil 12, which can have a ferrite core, and a capacitor 14. The coil 12 and the capacitor 14 together form an oscillating circuit 16, which can be excited to oscillate by means of an oscillator or generator 18. The oscillation frequency or resonant frequency of the oscillating circuit 16 can be defined by means of the dimensioning of the coil 12 and of the capacitor 14. The inductance of the coil 12 and the capacitance of the capacitor 14 are defined in such a way that the resonant frequency of the oscillating circuit 16 lies in the range of from 0.8 MHz to 20 MHz. This allows a good suitability of the proximity switch 200 for the sensing of objects made of carbon material.

The amplitude of the oscillator 18 is ascertained in a known manner by means of a limit value switch 20, wherein the limit value switch 20 generates a switching signal. The switching signal is then provided by an amplifier 22 at an output 24 for further processing.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a"

or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE CHARACTERS 100 proximity switch
200 proximity switch according to a preferred embodiment
S1, S2 transmitting coils
E1, E2 receiving coils
K capacitor
1 trigger or object to be sensed
2 generator
3 differential signal output
7 amplifier
8 limit value switch
10 low-pass filter
12 coil
14 capacitor
16 oscillating circuit
18 oscillator or generator
20 limit value switch
22 amplifier
24 output

What is claimed is:

1. A proximity switch comprising:
   an oscillating circuit configured to detect carbon based on a change in amplitude of a detection signal,
   wherein the oscillating circuit has a resonant frequency in a range of from 0.8 MHz to 20 MHz,
   wherein the oscillating circuit comprises a first pair of coils, a second pair of coils, and a capacitor,
   wherein the first pair of coils includes a first transmitting coil and a first receiving coil, and
   wherein the second pair of coils includes a second transmitting coil and a second receiving coil.

2. The proximity switch according to claim 1, wherein the oscillating circuit has a resonant frequency in a range of from 1 MHz to 14 MHz.

3. The proximity switch according to claim 1, wherein the first transmitting coil and/or the second transmitting coil are each formed as a printed transmitting coil.

4. The proximity switch according to claim 1, wherein the first transmitting coil and/or the second transmitting coil has an inductance in a range of from 0.4 µH to 4 µH; and/or
   wherein the capacitor has a capacitance in a range of from 22 pF to 2.2 nF.

5. The proximity switch according to claim 1, further comprising an amplifier configured to amplify a received signal received by the oscillating circuit, wherein the amplifier has at least one filter stage and at least one capacitive element matched to the resonant frequency of the oscillating circuit.

6. The proximity switch according to claim 5, wherein the amplifier is set up to reduce external capacitive influences on a phase position of the excitation of the oscillating circuit.

7. A method for detecting carbon with a proximity switch, the method comprising:
   providing an oscillating circuit in the proximity switch, the oscillating circuit comprising a first pair of coils, a second pair of coils, and a capacitor, wherein the first pair of coils includes a first transmitting coil and a first receiving coil and the second pair of coils includes a second transmitting coil and a second receiving coil;
   emitting, by the proximity switch, a detection signal at a frequency in a range of from 0.8 MHz to 20 MHz, and
   detecting carbon using the oscillating circuit based on a change in amplitude of the detection signal.

8. The proximity switch according to claim 3, wherein the first transmitting coil and/or the second transmitting coil has an inductance in a range of from 0.4 µH to 4 µH; and/or
   wherein the capacitor has a capacitance in a range of from 22 pF to 2.2 nF.

9. The proximity switch according to claim 1, wherein the proximity switch is configured as an inductive proximity switch.

10. The method according to claim 7, wherein the detection signal comprises only a single frequency.

11. The proximity switch according to claim 1, wherein the detection signal is emitted by the oscillating circuit, the detection signal being emitted with the resonant frequency of the oscillating circuit.

12. The proximity switch according to claim 1, wherein the resonant frequency is 7 MHz.

13. A proximity switch comprising:
    an oscillating circuit configured to detect carbon based on a change in amplitude of a detection signal, the oscillating circuit comprising a first pair of coils and a second pair of coils, the first pair of coils including a first transmitting coil and a first receiving coil, and the second pair of coils including a second transmitting coil and a second receiving coil; and
    an amplifier configured to amplify a received signal received by the oscillating circuit,
    wherein the oscillating circuit has a resonant frequency in a range of from 0.8 MHz to 20 MHz, and
    wherein the amplifier has at least one filter stage and at least one capacitive element matched to the resonant frequency of the oscillating circuit.

14. The proximity switch according to claim 13, wherein the oscillating circuit has a resonant frequency in a range of from 1 MHz to 14 MHZ.

15. The proximity switch according to claim 13, wherein the amplifier is set up to reduce external capacitive influences on a phase position of the excitation of the oscillating circuit.

16. The proximity switch according to claim 13, wherein the proximity switch is configured as an inductive proximity switch.

17. The proximity switch according to claim 13, wherein the detection signal is emitted by the oscillating circuit, the detection signal being emitted with the resonant frequency of the oscillating circuit.

18. The proximity switch according to claim 13, wherein the resonant frequency is 7 MHz.

19. The proximity switch according to claim 1, wherein the first pair of coils are wound in the same direction and the second pair of coils are wound in an opposite direction relative to one another.

* * * * *